United States Patent
Gautham

(10) Patent No.: US 8,911,636 B2
(45) Date of Patent: Dec. 16, 2014

(54) MICRO-DEVICE ON GLASS

(71) Applicant: Viswanadam Gautham, Singapore (SG)

(72) Inventor: Viswanadam Gautham, Singapore (SG)

( * ) Notice: Subject to any disclaimer, the term of this patent is extended or adjusted under 35 U.S.C. 154(b) by 0 days.

(21) Appl. No.: 14/040,698

(22) Filed: Sep. 29, 2013

(65) Prior Publication Data

US 2014/0054261 A1 Feb. 27, 2014

(51) Int. Cl.
*C23F 1/00* (2006.01)
*B44C 1/22* (2006.01)
*B81C 1/00* (2006.01)
*H01L 21/00* (2006.01)

(52) U.S. Cl.
CPC ............ *B81C 1/00341* (2013.01); *H01L 21/00* (2013.01)
USPC ......... 216/2; 216/31; 216/33; 216/41; 216/83

(58) Field of Classification Search
CPC .................. H01L 21/00; H01L 21/187; B81C 2203/0109; B81C 1/00269; B81C 1/0046; B81C 2201/0154; B81C 1/00246; B81C 1/00341; B81C 1/00873; B81C 2203/019; B81C 2203/036; B81C 2203/0735; B81C 3/008
USPC ...................................... 216/2, 31, 33, 41, 83
See application file for complete search history.

(56) References Cited

U.S. PATENT DOCUMENTS

| | | | | |
|---|---|---|---|---|
| 6,808,956 | B2 * | 10/2004 | Cabuz et al. | 438/52 |
| 7,413,846 | B2 * | 8/2008 | Maloney et al. | 430/320 |
| 2004/0180464 | A1 * | 9/2004 | Horning et al. | 438/51 |
| 2005/0280116 | A1 * | 12/2005 | Wu et al. | 257/528 |
| 2006/0014358 | A1 * | 1/2006 | Sawyer et al. | 438/412 |
| 2006/0110854 | A1 * | 5/2006 | Horning et al. | 438/121 |

* cited by examiner

*Primary Examiner* — Shamim Ahmed
(74) *Attorney, Agent, or Firm* — Inventa Capital PLC

(57) ABSTRACT

A method of fabricating a micro-device having micro-features on glass is presented. The method includes the steps of preparing a first glass substrate, fabricating a metallic pattern on the first glass substrate, preparing a second glass substrate and providing one or more apertures on the second glass substrate, heating the first glass substrate and the second glass substrate with a controlled temperature raise, bonding the first glass substrate and the second glass substrate by applying pressure to form a bonded substrate, wherein the metallic pattern is embedded within the bonded substrate, cooling the bonded substrate with a controlled temperature drop and thereafter maintaining the bonded substrate at a temperature suitable for etching, etching the metallic pattern within the bonded substrate, wherein an etchant has access to the metallic pattern via the apertures, forming a void within the bonded substrate, wherein the void comprises micro-features.

10 Claims, 4 Drawing Sheets

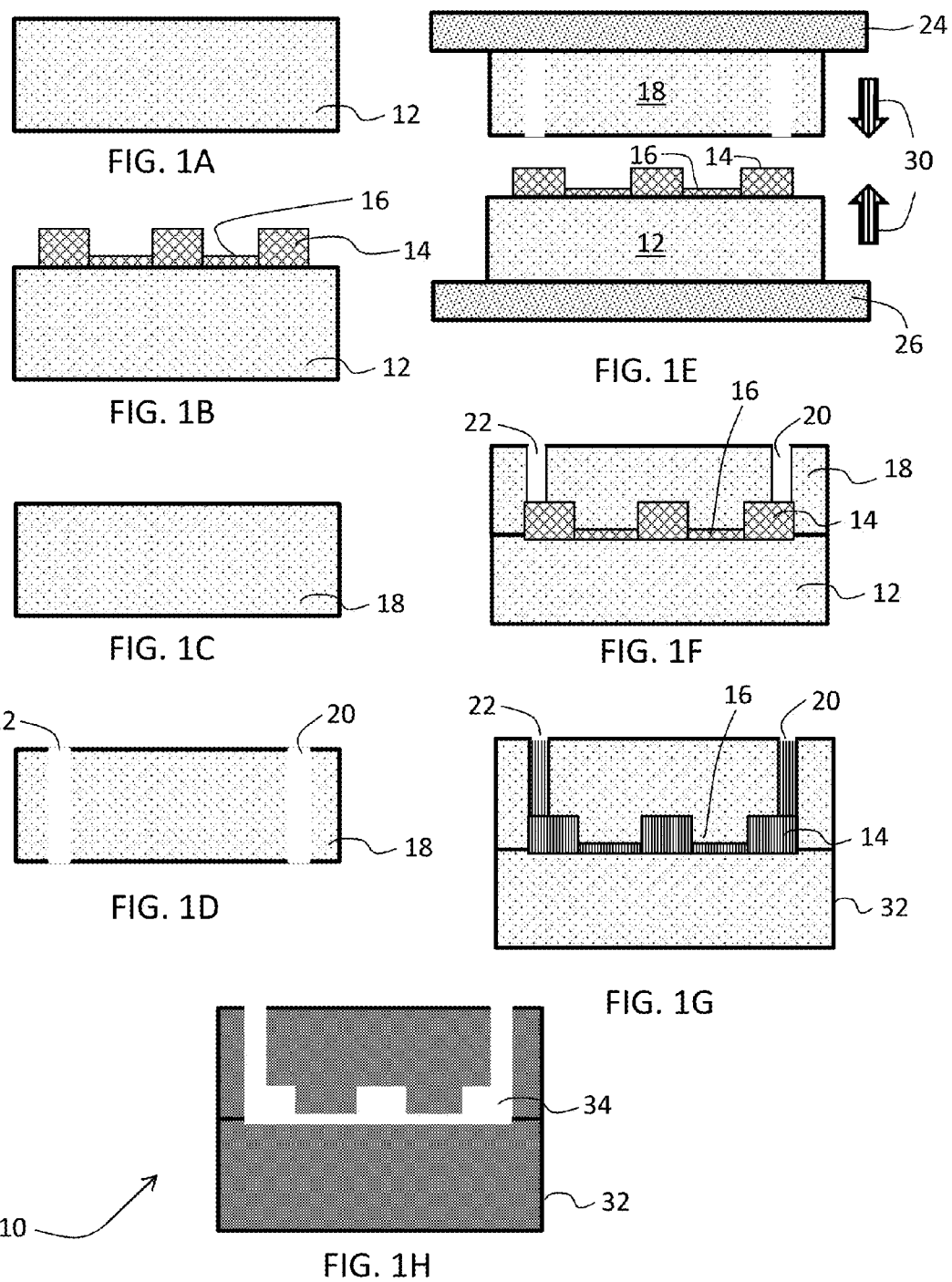

FIG. 2A
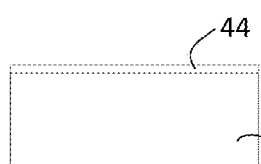
FIG. 2B
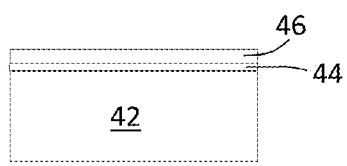
FIG. 2C
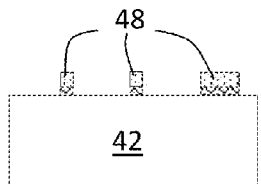
FIG. 2D
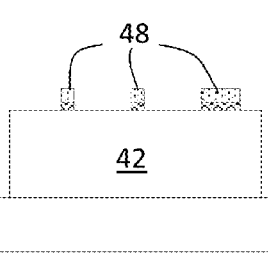
FIG. 2E
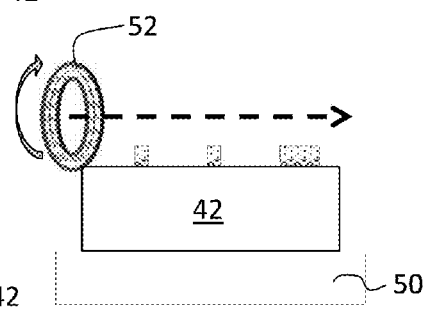
FIG. 2F
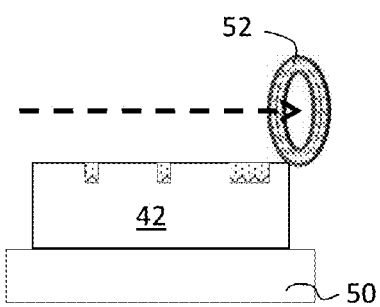
FIG. 2G
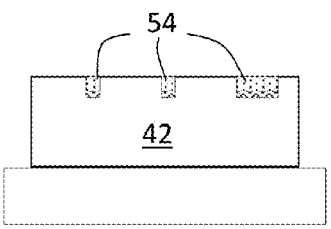
FIG. 2H
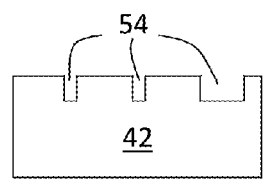
FIG. 2I
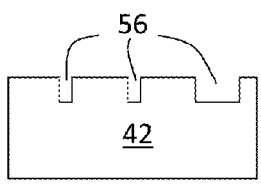
FIG. 2J
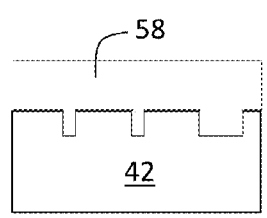
FIG. 2K

MICRO-DEVICE ON GLASS

RELATED APPLICATIONS

This application claims priority to Patent Cooperation Treaty Application number PCT/SG2011/000129, filed on Mar. 30, 2011, and incorporated herewith by reference in its entirety.

FIELD OF THE INVENTION

The present invention is in the field of manufacturing micro-devices. In particular, the present invention relates to a method of manufacturing micro-devices on glass substrate.

BACKGROUND OF THE INVENTION

A Lab-on-Chip device is a subset of Micro Electro-mechanical System ("MEMS") device, also referred to as micro-device, and typically used to miniaturize bio-chemical analysis and synthesis. Micro-devices include micro-features such as micro-channels, micro-capillaries, micro-mixers, micro heaters, and/or micro-chambers. Two or more substrates are bonded together such that the micro-features in one substrate are aligned with micro-features on the second substrate to form, for example, a micro-capillary. Such micro-capillary can accommodate fluids (such as liquids and/or gases) to be transported or stored, with the intention to perform a chemical reaction between constituents of the fluid, or to separate or mix constituents of portions of the fluid, and subsequently perform chemical or physical analysis on the constituents of the fluid, either on or off the chip.

Certain advantages of micro-devices compared to conventional systems include low operating costs (due to miniscule volumes of reagents used), faster response time due to high surface to volume ratio, possibility of mass parallelization due to small size, and lower fabrication costs due to mass production. Furthermore, micro-reactors within such micro-devices offer certain additional benefits over conventional scale reactors, for example, high energy efficiency, reaction speed and yield, safety, reliability, scalability, on-site/on-demand production, and better process control capabilities.

Typically, present day micro-devices are manufactured using silicon substrates. Manufacturing on a silicon substrate is well-established process derived from the micro-electronic semiconductor industry. However, producing such micro-devices using traditional process on silicon substrates incur high production costs. For example, silicon micro-devices that needs to be configured for handling chemical or biological sample needs to implement CMOS-like processes and further processes such as surface treatment to achieve biocompatible micro-features. Such processes make the conventional manufacturing process expensive.

Furthermore, conventional techniques use sealing methods that dispense polymer forming liquids, such as epoxies and the like, that are undesirable for micro-devices used in chemical or biological applications. For example, dispensing a uniformly thick material layer on exact positions along the periphery of an engraved micro-feature is extremely difficult. Further, properties of such sealing materials such as porosity, mechanical integrity, and interference of the material with organic solvents within the micro-features pose certain challenges during operation of the micro-devices. Furthermore, such sealing methods have the disadvantages that an electric field is required for bonding.

The above methods are not suitable where sealing is required on metal patterns that are present in-between the two substrates. Sealing over metal micro-features that are extended over one of the substrates may result in liquid leakage even after a careful heat treatment during the thermal bonding procedure. The prevention of leakage is crucial for fluidic systems, since leakage can give rise to cross-talk between adjacent fluidic conduits and leads to dead-volumes that give rise to cross-contamination of subsequent samples. Prevention of leakage is particularly important in fluidic systems which are to be used for gas analysis, systems in which gases are formed by reaction in the channel, or systems in which gas is introduced into a liquid in order to perform a chemical reaction on a chip, such as in micro-reactors for high-throughput screening of chemical substances.

Therefore, there is a need for a scalable manufacturing technique that is capable of forming micro-features on substrate that are relatively passive towards chemicals and gases used for analysis. Further, there is a need for a simple and efficient bonding between two such substrates to form a leak-proof micro-device.

BRIEF DESCRIPTION

Briefly, a method of fabricating a micro-device having micro-features on glass is presented. The method includes the steps of preparing a first glass substrate, fabricating a metallic pattern on the first glass substrate, preparing a second glass substrate and providing one or more apertures on the second glass substrate, heating the first glass substrate and the second glass substrate with a controlled temperature raise, bonding the first glass substrate and the second glass substrate by applying pressure to form a bonded substrate, wherein the metallic pattern is embedded within the bonded substrate, cooling the bonded substrate with a controlled temperature drop and thereafter maintaining the bonded substrate at a temperature suitable for etching, etching the metallic pattern within the bonded substrate, wherein an etchant has access to the metallic pattern via the apertures, forming a void within the bonded substrate, wherein the void comprises micro-features.

In another embodiment, a method of forming a pattern on glass is presented. The method includes the steps of preparing a glass substrate, fabricating a first metallic pattern on the glass substrate, heating the glass substrate with a controlled temperature raise, embedding the first metallic pattern within the glass substrate, cooling the glass substrate with a controlled temperature drop, fabricating a second metallic pattern on the glass substrate, heating the glass substrate with a controlled temperature raise, embedding the second metallic pattern within the glass substrate, cooling the glass substrate with a controlled temperature drop and thereafter maintaining the glass substrate at a temperature suitable for etching, and etching away the second metallic pattern to form a void, wherein the void comprises micro-features.

In another embodiment, a glass microfluidic device comprising a bonded glass substrate and a plurality of micro-features are presented. The micro features are formed via a process comprising the steps of fabricating a metallic pattern on a first glass substrate, preparing a second glass substrate and providing one or more apertures on the second glass substrate. Fabricating active elements on the second glass substrate, heating the first glass substrate and the second glass substrate with a controlled temperature raise, bonding the first glass substrate and the second glass substrate by applying pressure to form a bonded glass substrate, wherein the metallic patterns and active elements are embedded within the bonded glass substrates, cooling the bonded substrate with a controlled temperature drop and maintaining the bonded substrate at a temperature suitable for etching, etching the metallic pattern within the bonded glass substrate, wherein an etchant has access to the metallic pattern via the apertures, and forming a void within the bonded glass substrate, wherein the void comprises micro-features, and the active elements remain in place.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIGS. 1A-1H illustrates various steps of an exemplary process steps of patterning on a glass substrate;

FIGS. 2A-2K illustrates various steps of an exemplary process steps of patterning on a glass substrate;

DETAILED DESCRIPTION

Figure 3:
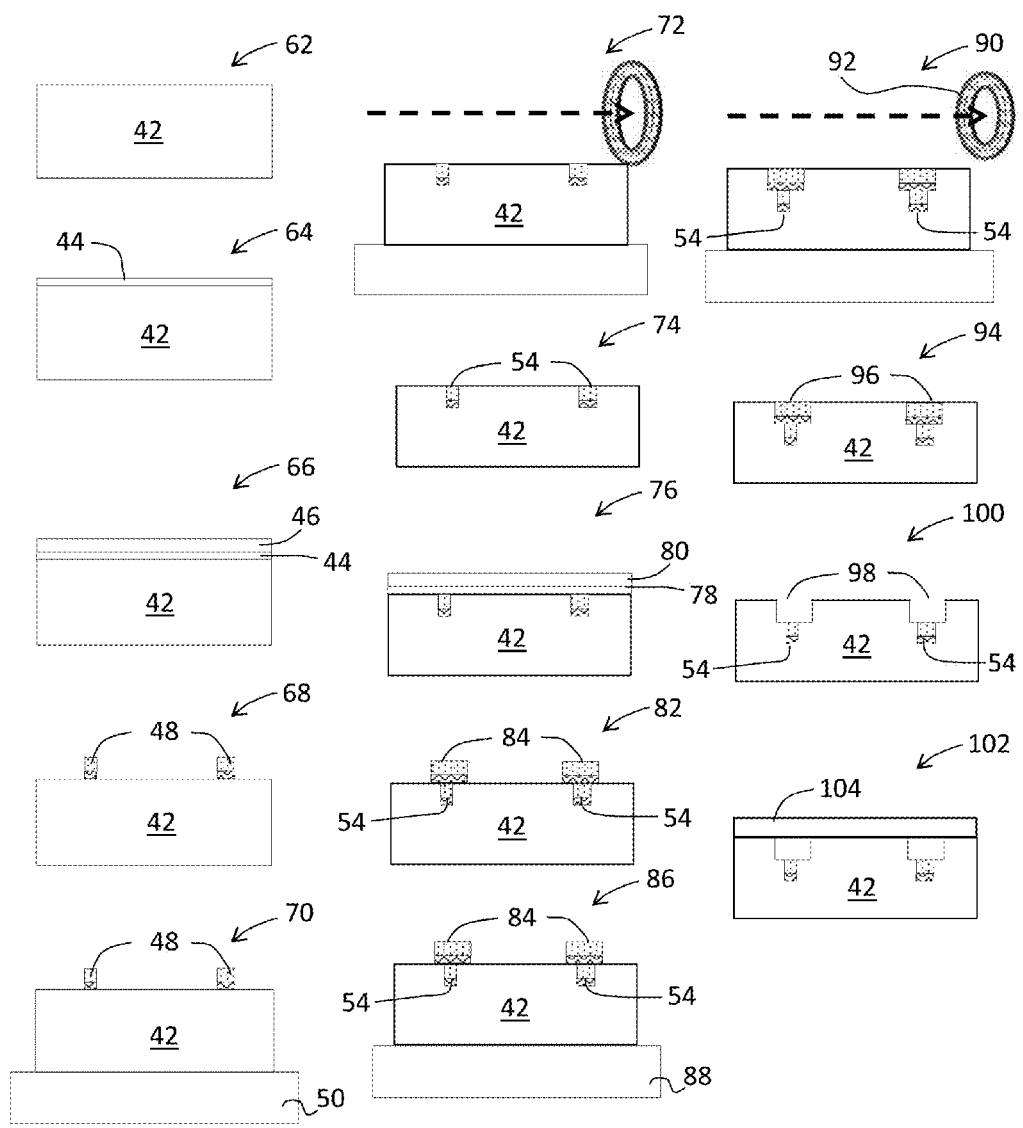
FIG. 3 illustrates various steps of yet another exemplary process of patterning on a glass substrate.

One example of a Lab-on-Chip device is a micro-device, wherein the micro-device includes micro-features such as micro-reactor for facilitating bio-chemical reactions to take place through a network of micro-channels and micro-chambers. As used herein, the term "micro-features" refers to "micro-channels", "micro-reactors", "micro-mixers", and/or "micro-chambers" and "micro-heaters". Hereinafter, the term "micro-systems" refers to micro-devices and systems that include, among the other things, such micro-features. In general, micro-devices used for bio-chemical reactions are also referred to as microfluidic devices. Such reactions could be used to analyse specific targets in samples or to synthesize specific by-products.

Glass, among the other materials, is suited for manufacturing bio-chemical micro-systems as glass is biocompatible, chemical corrosion resistive, stabile at high operational temperatures, good optical properties, and low material cost. Though preferable, the use of glass in micro-devices is limited due to poor mass manufacturability because micro-devices are expected to be produced in high volumes. Certain properties of glass such as brittleness make machining of micro-features inefficient when produced in high volumes. Standard silicon semiconductor manufacturing processes such as wet and dry etching on glass are slow, unpredictable due to varying composition of glass, and produce rough surfaces that needs further processing. Other techniques such as ultrasonic machining and laser machining are not suited for batch fabrication on glass and hence prove costly due to low productivity and lower yield.

Certain embodiments of the invention, as will be further discussed in detail, make use of certain properties of glass to produce micro-features that can be implemented in a scalable manufacturing process for achieving high volume, low cost micro-devices on glass substrate.

Turning now to FIGS. 1A-1H, an exemplary method of forming micro-features on glass is illustrated. The method 10 includes the initial step of preparing a first glass substrate 12 as illustrated in FIG. 1A. The glass substrate 12 is cleaned and prepared for subsequent step of forming metallic layers. Metallic pattern 14,16 is fabricated on the cleaned and prepared first glass substrate 12 as illustrated in FIG. 1B. The metallic pattern 14,16 in FIGS. 1B-1G are for illustration purposes only. It is envisaged that various patters of different shapes and sizes may be formed, as required by the application of the micro-device that is manufactured. Non-limiting examples of metal used for such metallic pattern comprises copper, nickel, aluminum, and platinum. It may be noted that standard lithographic process may be adapted for forming such metallic patterns. A second glass substrate 18 (FIG. 1C) is prepared in a similar manner as discussed above and one or more apertures 20,22 are provided on the second glass substrate 18 (FIG. 1D). Such apertures, in one embodiment, are holes that pass through the substrate. In one embodiment, the through apertures 20,22 are made by power blasting, deep reactive ion etching, or ultrasonic drilling.

In the subsequent step, referring now to FIG. 1E, the first glass substrate 12 and the second glass substrate 18 are heated via heating elements 24,26 up to a transition temperature of glass wherein the temperature raise is gradual and controlled. Typically, at such transition temperatures, in the range of about 500° C. to about 700° C., the glass substrates 12,18 softens and the metal pattern 14,16 fabricated on top of the first glass substrate 12 remains substantially unaffected due to the higher melting temperature of the metal compared to glass. It may be noted that the transition temperature of glass depends on its composition and therefore varies depending on the type of glass used in the glass substrate. Subsequent to glass substrates 12,18 attaining transition temperature, the first glass substrate 12 and the second glass substrate 18 are substantially aligned and compressed at suitable pressure as indicated by reference numeral 30, such that the metallic pattern 14,16 is embedded into the glass substrates 12,18. Pressure may be in the range of about 1N to about 10 kN depending on, for example, the thickness of the metallic substrate.

Subsequent to the step of applying pressure at transition temperature, FIG. 1F illustrates bonding the first glass substrate 12 and the second glass substrate 18 to form a bonded substrate 32, wherein the metallic pattern 14,16 is embedded within the bonded substrate 32. Bonded substrate 32 is cooled in a controlled temperature drop, and thereafter maintaining the bonded substrate at a temperature suitable for etching. For example, such suitable temperature includes a predetermined temperature of the etchant solution which is substantially the same temperature as the bonded substrate. The controlled cooling rate (temperature drop) is so chose such that the glass substrates 12,18 and embedded metal 14,16 does not undergo thermal shock or effects such as Co-efficient of Thermal Expansion ("CTE") mismatch. The bonded substrate 32 is maintained at a steady state temperature (in the range of about 50° C. to about 75° C.). In an exemplary embodiment, the bonded substrate 32 is further processed by chemical etching. For example, the chemical etching includes dipping the bonded substrate 32 in a metal etchant solution (suitable chemical solution), wherein the etchant solution has access to the metallic pattern 14,16 via the apertures 20,22. The metallic pattern 14,16 that is embedded within the bonded substrate 32 is etched away by the metal etchant solution that is maintained at the same temperature as the bonded substrate to prevent sudden temperature change of the bonded substrate (FIG. 1G). After a predetermined time, metal etchant solution etches away the metal by eroding the metallic pattern from the glass substrate to form a void 34 having micro-features as illustrated in FIG. 1H. The time period (a predetermined time duration) for dipping the bonded substrate in the etchant solution depends on the thickness of the metallic pattern to be eroded, and the type metal used for the metallic pattern.

After the etching process, the void that is left within the bonded substrate comprises micro-features 34. As discussed earlier, such micro-features can include but not limited to micro-channels, micro-reactor, micro-mixers, and micro-chambers.

FIGS. 2A-2K illustrates an exemplary method of forming micro-features on glass according to an embodiment of the invention. The method 40 comprises the initial step of preparing a glass substrate 42 as illustrated in FIG. 2A. The glass substrate 42 is cleaned and prepared for the subsequent step of forming a thin film deposition. A thin barrier layer 44 is formed on the cleaned and prepared glass substrate 42 as illustrated in FIG. 2B. Further, electroplating is performed such that a desired thickness of metal layer 46 is formed on the thin barrier layer 44 as illustrated in FIG. 2C. Lithographic patterning of metal layer 46 and barrier layer 44 is performed such that a first metallic pattern 48 is formed on the glass substrate 42 as illustrated in FIG. 2D. The metallic pattern 48 in the illustrated embodiments are for illustration purposes only. It is envisaged that various patters of different shapes and sizes may be formed, as required by the application of the micro-device that is manufactured. Non-limiting examples of metal used for such metallic pattern comprises copper, nickel, aluminum, and platinum. Turning now to FIG. 2E, a heating element 50 is configured for heating the glass substrate 42 up to a transition temperature wherein the temperature raise is gradual and controlled. Typically, at such transition temperatures, in the range of about 500° C. to about 700° C., the glass substrate 42 softens and the first metallic pattern 48 fabricated on top of the glass substrate 42 remains substantially unaffected due to the higher melting temperature of the metal compared to glass. FIG. 2F illustrates a metallic roller 52 that is configured to roll over the hot, softened glass substrate 42 and the first metallic pattern 48 formed thereafter, such that the first metallic pattern 48 is embedded within the glass substrate 42 (FIG. 2G-H). The roller 52 in one embodiment is a hot roller. The roller 52 is configured to apply pressure in the range of about 1N to about 10 kN. The glass substrate 42 along with the embedded first metallic pattern 54 is cooled in a controlled temperature drop and thereafter maintained at a temperature suitable for etching. The cooled substrate 42 along with the embedded first metallic pattern 54 is further processed by etching away the first metallic pattern 54 as illustrated in FIG. 2J. The etching process may include chemical etching techniques as discussed above. FIG. 2J illustrates the void 56 formed on the glass substrate 42 after the embedded first metallic pattern 54 is etched away. It may be noted that such void 56 includes micro-features as discussed above.

As a final step in the process of manufacturing the micro-device, a sealing cap 58 is provided on the top surface of the glass substrate 42 as illustrated in FIG. 2K, also referred to as capping, wherein the micro-features are sealed to make it leak proof such that the micro-device can be used for microfluidic applications. Clear and transparent elastomer can be implemented as sealing caps that bonds naturally to glass using a surface phenomenon.

FIG. 3 illustrates another embodiment of the invention, wherein an exemplary process of forming micro-features on glass substrate is presented. The sequential process steps in FIG. 3 as indicated by the reference numerals 62-74 are substantially similar to the steps discussed in FIG. 2A-2I. Further to the above steps, in the present embodiment, there is a second metallic layer 80 that is formed subsequent to the first metallic layer. Furthermore, in this embodiment, the first metallic layer may comprise metal such as gold for example, which is a good conductor of heat and electricity. Referring to step 76, after the first metallic layer 54 is embedded within the glass substrate 42, a second barrier layer 78 is formed on the embedded first metallic layer 54 and subsequently, the second metallic layer 80 is formed on the second barrier layer 78. In step 82, further lithographic process on the second barrier layer 78 and the second metallic layer 80 is performed such that a second metallic pattern 84 is formed. The glass substrate 42 along with the embedded first metallic layer 54 and the second metallic pattern 84 is heated by a heating element 88 with a controlled and gradual temperature raise up to glass transition temperature as illustrated in step 86. The second metallic pattern 84 fabricated on top of the glass substrate 42 remains substantially unaffected due to the higher melting temperature of the metal compared to glass. Reference numeral 90 illustrates a metallic roller 92 that is configured to roll over the hot glass substrate 42 and the second metallic pattern 84 formed thereafter such that the second metallic pattern 84 is embedded within the glass substrate 42 as illustrated in step 94. The roller 92 in one embodiment is a hot roller. The roller 92 is configured to apply pressure in the range of about 1N to about 10 kN. The glass substrate 42 along with the embedded second metallic pattern 96 is cooled in a controlled temperature drop.

The cooled substrate 42 along with the embedded second metallic pattern 96 is further processed by etching away the second metallic pattern 54. The etching process may include chemical etching techniques as discussed above. Reference numeral 100 illustrates void 98 that are formed within the glass substrate 42 after the embedded second metallic pattern 96 is etched away. For example, such double layer patterning may be implemented for manufacturing active components as micro-features within the micro-devices. In one embodiment, the embedded first metallic layer 54 can be configured as electrical pads or detection electrodes and coupled to external devices via interconnects.

As a final step in the process of manufacturing the micro-device, a sealing cap 102 is provided on the top surface of the glass substrate 42 wherein micro-features 98 formed on the glass substrate 42 are sealed to make it leak proof such that the micro-device can be used for microfluidic applications, as illustrated by the reference numeral 102.

Figure 4:
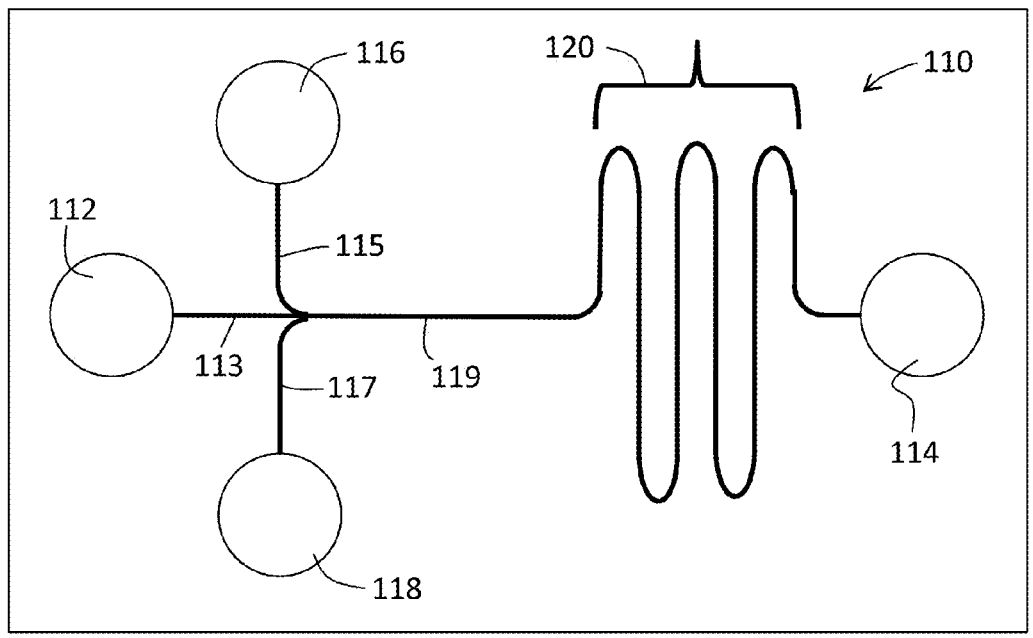
FIG. 4 illustrates a top view of exemplary micro-features within the glass substrate according to an embodiment of the invention.
Figure 5:
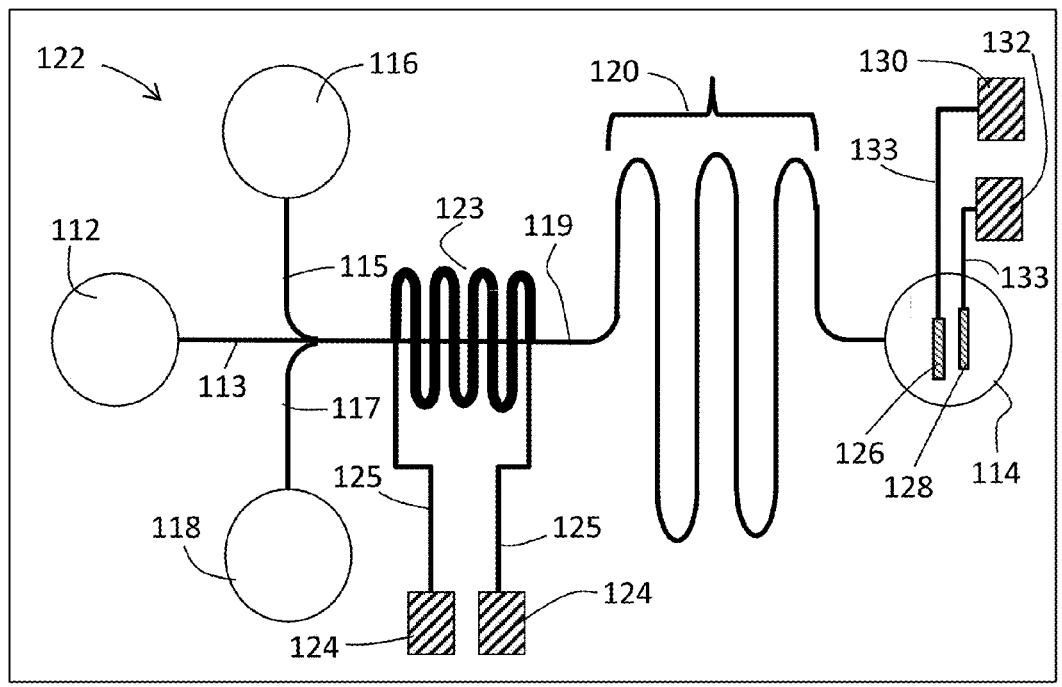
FIG. 5 illustrates a top view of exemplary micro-features within the glass substrate according to an embodiment of the invention.

FIGS. 4 and 5 illustrates a top view of exemplary micro-features that are fabricated on glass substrate according to an embodiment of the invention. In one embodiment, the micro-features illustrated in FIGS. 4 and 5 may be patterned implementing one of the processes as discussed above. FIG. 4 illustrates an exemplary micro-device 110 having multiple micro-features such as inlet port 112, outlet port 114, holding chambers 116, 118, and micro-mixer 120. Micro-features can be interconnected via the micro-channels 113, 115, 117, and 119. In the illustrated embodiments of FIG. 4, the micro-features 112-120 enable the micro-device 110 to perform as a microfluidic device.

Turning now to FIG. 5, micro-device 122 includes micro-features having active elements. For example, a micro-heater 123 is coupled to electrical pads 124. For example, an external power source can be coupled to the electrical pads 124 through the interconnects 125 and configured to provide power to the micro-heater 123. Another example of an active element is the detection electrodes 126, 128 coupled respectively to electrical pads 130, 132 via the interconnects 133. In manufacturing a micro-device 122, processes as disclosed herein may be implemented, and in particular, the process as discussed with respect to FIG. 3 that includes at least two metallic layer embedded within the glass layer may be implemented, wherein the first metallic layer forms the active elements such as electrical pads or detection electrodes.

In an exemplary operation of the micro-device 122, a working fluid (or gas) can be introduced into the micro-device via the inlet port 112. The fluid, by the phenomena of micro-capillary effect, flow within the micro-channel 113. As required by the application of the micro-device, the fluid may be stored in the holding chambers 116,118 coupled to the inlet port via the micro-channel 115,117. The micro-channel 119 couples the micro-channels 113, 115, 117 to the micro-mixer 120. The fluid, while passing the micro-channel 119, can be heated by powering up the micro-heater 123. Upon reaching the micro-mixer 120, the fluid passes through the winding micro-channel that introduces a mixing effect. The mixed fluid may then be stored in the outlet port 114 wherein further processing is possible. For example, detection electrodes 126, 128 can be configured to detect the contents, texture, temperature, and other attributes of the fluid. In one embodiment, the detection electrodes 126, 128 are coupled to a detection device via the interconnects 133 and the electrical pads 130, 132.

Advantageously, the process of manufacturing micro-devices as disclosed in various embodiments of the invention are scalable processes and such processes are easily replicated for complex patterns and also for high feature density micro-devices. Such glass substrate can be a single die base or a wafer depending on the volume of production, and the process being the same in either case. Furthermore, such approach of manufacturing micro-devices presents economy of scale. Integrating of active components in the microfluidic device like metallic electrodes, heaters, sensors, etc are simple and cost effective. As glass is not machined or chemically processed at any stage according to the disclosed embodiments of the invention. Micro-features are sharp and clear with surface roughness substantially the same as the roughness of the sidewalls of the metallic pattern. Such surface finish makes the glass micro-devices very conducive to microfluidic flow and biochemical reactions. Furthermore, glass provides good optical clarity and minimizes chances of device failure. Further processing or surface treatment is not necessary. Integrated active elements serve various purposes such as electroosmotic or electrokinetic flow control, electrophoretic separation, or electrochemical detection. As disclosed in the embodiments herein, the sealing technique between two glass substrates is hermetic and does not require adhesive or glue. Further, such sealing techniques provide no scope for contamination as epoxy is not implemented in the sealing procedure. De-gasing or curing is not required. A glass to glass seal is a homogenous bonding and therefore there is no porosity.

The processes of making micro-devices as disclosed herein, results in repeatable and scalable microfluidic manufacturing techniques. Examples of such micro-devices include but not limited to point-of-care diagnostic and forensic devices, devices for various drug discovery applications, devices for protein and other bimolecular synthesis, devices for various nanoparticle synthesis, devices for genomic and proteomic analysis that are both point of care or research lab based, opto-electronic devices, wireless communications devices based on radio frequency (RF), capping glass wafers for wafer level packaging of radio frequency ("RF") MEMS and Light Emitting Diode ("LED") device wafers, various micro-reactor chips like T-Junction Chips, Droplet Generator Chips, Droplet Junction Chips, Micro-mixer Chips, solar thin film cells, inkjet printer head, and Custom Microfluidic Chips. Another application of the embodiments of the inventions includes microchip cooling, wherein the micro-device may be configured for mounting on a micro-chip that requires external cooling, and in one embodiment, a coolant may be circulated through the micro-channels.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of fabricating a micro-device having micro-features on glass, the method comprising the steps of:
    (a) preparing a first glass substrate;
    (b) fabricating a metallic pattern on the first glass substrate;
    (c) preparing a second glass substrate and providing one or more apertures on the second glass substrate;
    (d) heating the first glass substrate and the second glass substrate with a controlled temperature raise;
    (e) bonding the first glass substrate and the second glass substrate by applying pressure to form a bonded substrate, wherein the metallic pattern is embedded within the bonded substrate;
    (f) cooling the bonded substrate with a controlled temperature drop and thereafter maintaining the bonded substrate at a temperature suitable for etching;
    (g) etching the metallic pattern within the bonded substrate, wherein an etchant has access to the metallic pattern via the apertures; and
    (h) forming a void within the bonded substrate, wherein the void comprises micro-features.

2. The method according to claim 1, wherein the step of fabricating the metallic pattern comprises thin film deposition, lithography, etching, and electroplating and metallic film lamination.

3. The method according to claim 1, wherein the step of providing one or more apertures comprises power blasting, deep reactive ion etching, laser drilling, or ultrasonic drilling.

4. The method according to claim 1, wherein the step of heating the first glass substrate and the second glass substrate comprises heating the glass substrates up to a transition temperature of glass.

5. The method according to claim 1, wherein the step of etching the bonded substrate further comprises dipping the bonded substrate in an etchant solution for a predetermined time duration.

6. The method according to claim 5 further comprises maintaining the predetermined temperature of the etchant solution at substantially the same temperature as the bonded substrate.

7. The method according to claim 1, wherein the step of etching comprises chemical etching.

8. A method of manufacturing a glass micro-device comprising a bonded glass substrate and a plurality of micro-features, the micro-features formed via a process comprising the steps of:
    fabricating a metallic pattern on a first glass substrate;
    preparing a second glass substrate and providing one or more apertures on the second glass substrate;
    heating the first glass substrate and the second glass substrate with a controlled temperature raise;
    bonding the first glass substrate and the second glass substrate by applying pressure to form a bonded glass substrate, wherein the metallic pattern is embedded within the bonded glass substrate;
    cooling the bonded substrate with a controlled temperature drop and maintaining the bonded substrate at a temperature suitable for etching;

etching the metallic pattern within the bonded glass substrate, wherein an etchant has access to the metallic pattern via the apertures; and forming a void within the bonded glass substrate, wherein the void comprises micro-features.

9. The method of manufacturing the glass microfluidic device according to claim 8, wherein the micro-features comprises microfluidic channels, micro-chambers, micro-jet printers, and micro-mixers.

10. The method of manufacturing the glass microfluidic device according to claim 8 further comprises interconnects coupled to active components.

\* \* \* \* \*